United States Patent [19]

Wile

[11] 4,455,681

[45] Jun. 19, 1984

[54] DUAL THRESHOLD WIDE BAND/NARROW BAND AGC

[76] Inventor: Donald T. Wile, 2771 Longford Dr., San Jose, Calif. 95132

[21] Appl. No.: 332,574

[22] Filed: Dec. 21, 1981

[51] Int. Cl.³ .......................... H04B 1/16; H03F 3/45
[52] U.S. Cl. ..................................... 455/243; 455/155;
   455/246; 455/253; 330/257; 330/254
[58] Field of Search ............... 455/155, 234, 239, 246,
   455/247, 250, 253, 242, 243; 330/254, 257, 278, 288

[56] References Cited

U.S. PATENT DOCUMENTS

| | | | |
|---|---|---|---|
| 3,673,499 | 6/1972 | Avins | 455/155 |
| 3,821,649 | 6/1974 | Grosjean | 455/234 |
| 4,186,351 | 1/1980 | Brefini et al. | 455/234 |
| 4,219,778 | 8/1980 | Ishii | 455/155 |
| 4,339,728 | 7/1982 | Monticelli | 330/257 |

Primary Examiner—Jin F. Ng

[57] ABSTRACT

A radio receiver incorporates an AGC system having an upper wide band threshold and a narrow band threshold. Both thresholds are made temperature independent. The narrow band threshold is related to the circuit response to tuning meter voltage and the wide band threshold is related to the tuner output prior to i-f selectivity. When these responses are logically anded, an AGC response having the desirable characteristics of both narrow band and wide band systems is achieved. An IC form of AGC circuit is disclosed.

6 Claims, 3 Drawing Figures

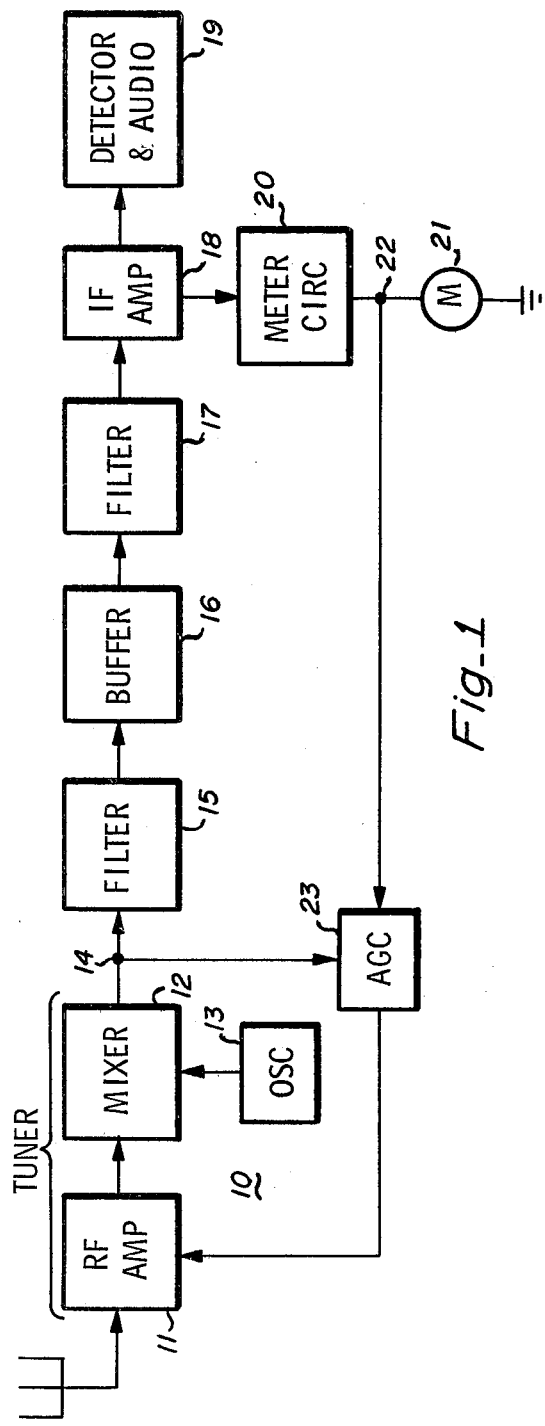
Fig._1
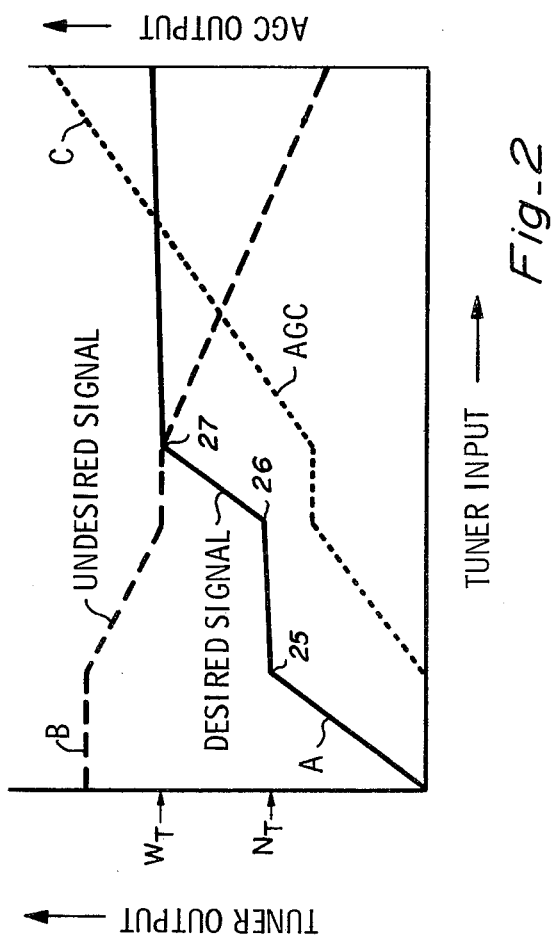
Fig._2

DUAL THRESHOLD WIDE BAND/NARROW BAND AGC

BACKGROUND OF THE INVENTION

The invention relates to radio receivers that employ Automatic Gain Control (AGC) and in particular relates to an integrated circuit (IC) for achieving the desired results. In modern receiver practice, a tuner converts the r-f input signals to an i-f at which frequency the signal is amplified. The receiver is broadly selective in the tuner and more sharply selective in the i-f amplifier. Commonly, the tuner includes an r-f amplifier that is gain controlled as a function of signals that lie within the band pass of the i-f selectivity. Such an AGC system is called narrow band because the i-f selectivity makes the AGC responsive only to in band signals. However, the selection of the AGC threshold is critical. If the threshold is too low, the receiver signal to noise (S/N) floor is too low. If the threshold is too high, interfering signals can mask a weaker desired signal. As an alternative, a wide band system can be employed. Here, the tuner output, prior to the i-f selectivity, can be sensed for AGC action. However, such a system is subject to a strong out of band signal activating the AGC and thereby desensitizing the tuner to a weaker desired in band signal.

The narrow band system is ordinarily employed and the AGC threshold is selected for a compromise. That is, the threshold is set to where the weak signal noise is high but acceptable and yet low enough to avoid serious weak signal masking. The main problem with such a system is the intermodulation effects. When there are two strong interfering tuner input signals separated by one channel spacing and one channel spacing from center frequency or two channel spacings apart and two channel spacings from center frequency, there will be produced an intermodulation product at the center frequency which can mask a weaker desired signal. It would be desirable to employ an AGC that would minimize the intermodulation and yet be responsive to the weak desired signals, and allow for maximum S/N floor in the absence of strong interfering signals.

SUMMARY OF THE INVENTION

It is an object of the invention to provide a combined narrow band low threshold, wide band high threshold AGC system in an IC form for use in a radio receiver.

It is a further object of the invention to sense in combination the tuning meter voltage and the tuner output in a radio receiver and to use the combination to develop an AGC voltage for application to the tuner.

These and other objects are achieved as follows. A differential amplifier is provided with a tail current that varies as a function of the radio receiver tuning meter voltage which is a narrow band response. A first narrow band threshold is established above which the tail current increase with signal strength. The differential amplifier inputs are offset with a bias voltage that establishes a second threshold. A tuner output signal amplifier is coupled to the biased off input of the differential amplifier where it is peak rectified with a polarity that opposes the offset bias. Thus a wide band threshold level is created and is made substantially higher than the first threshold. The differential amplifier output is sensed in a current mirror the output of which constitutes an AGC current. It is clear that the AGC current will be a function of the tuning meter voltage but only after the tuner output exceeds the second threshold value. This means that the dual thresholds ensure a large signal to noise floor for relatively strong signals when no strong undesired signals appear at the tuner output while reducing the intermodulation effects when there are strong interfering signals, without desensitizing the tuner for weak signals below the first AGC threshold.

BRIEF DESCRIPTION OF THE DRAWING

FIG. 1 is a block diagram of a radio receiver that employs both narrow and wide band AGC.

FIG. 2 is a graph showing the AGC action associated with FIG. 1 in the presence of a strong out of band undesired signal.

DESCRIPTION OF THE INVENTION

Figure 3:
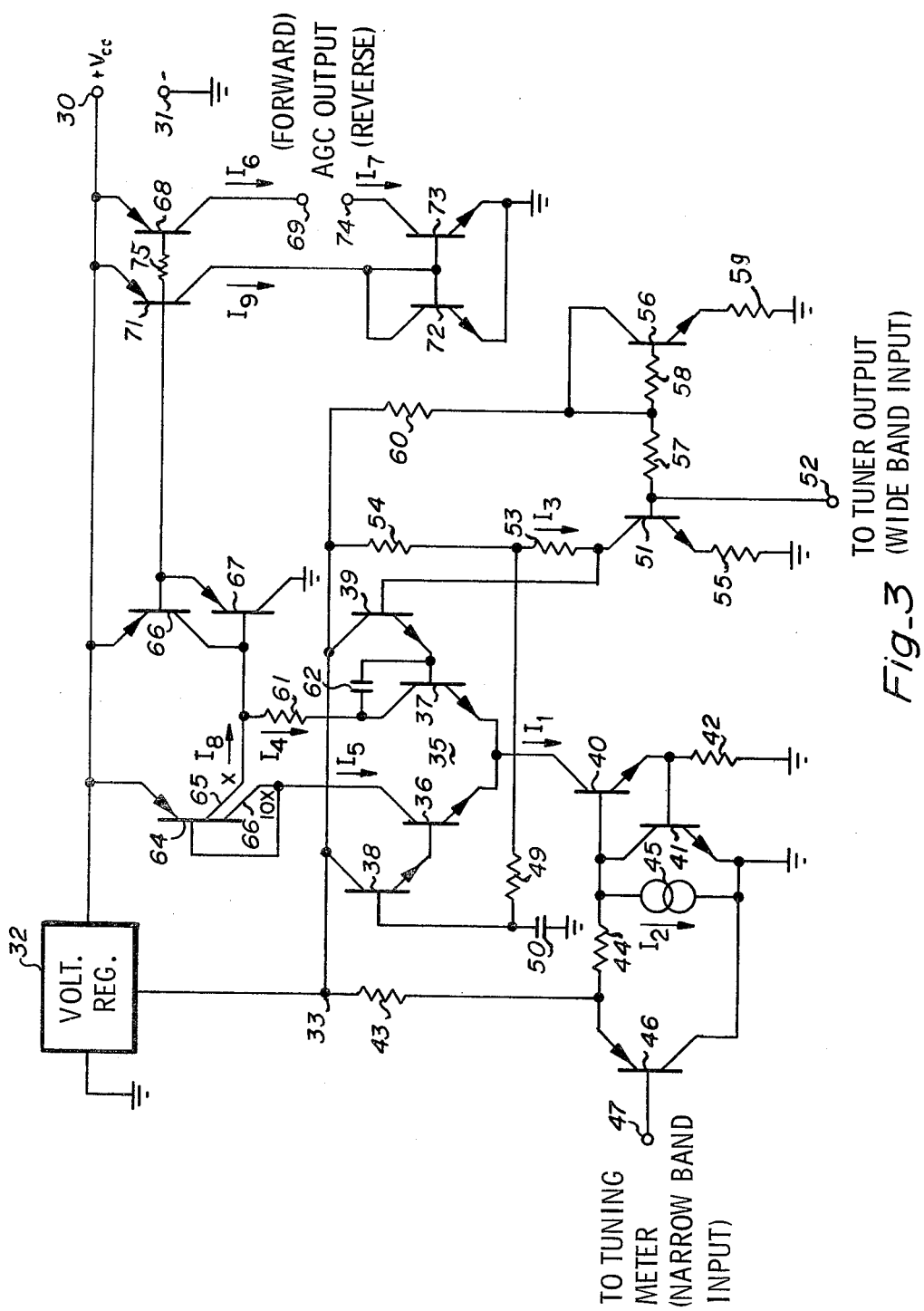
FIG. 3 is a schematic diagram of an IC useful in practicing the invention.

With reference to FIG. 1, a block diagram of a radio receiver is detailed. A tuner 10 is composed of r-f amplifier 11, mixer 12, and oscillator 13. Thus i-f signals are present at node 14. An i-f filter 15 is present to reject all but the desired i-f signals. A buffer 16 drives a second i-f filter 17 which drives i-f amplifier 18. If desired, part (or all) of the i-f gain can be incorporated into buffer 16. The configuration shown is most common. I-f amplifier 18 drives the conventional detector circuit 19, commonly found in such receivers. Typically, amplifier 18 also incorporates or drives tuning meter circuits 20 which in turn operate a meter 21. At node 22 there will be a voltage that is related to the strength of the receiver input signal.

The tuning meter voltage and the output of tuner 10 are both fed to the AGC circuit 23 which controls the gain of r-f amplifier 11. If desired, the AGC signal can also vary the gain of mixer 12.

The AGC circuit 23 is provided with a first threshold for the tuning meter voltage and a second higher threshold for the tuner output signal so that both of the thresholds must be exceeded for AGC. This action logically ands the two input signals. Since the tuning meter related signal passes through the i-f selectivity, it is called a narrow band input. The tuner output not being passed through the i-f selectivity is called a wide band input.

FIG. 2 is a graph showing the performance of the circuit of FIG. 1 in the presence of a strong undesired signal. The graph plots tuner output vertically as a function of tuner input horizontally. The point labeled $N_T$ denotes the narrow band AGC threshold while $W_T$ denotes the wide band AGC threshold which can desirably be 20 db higher.

The condition shown is a strong undesired signal shown as dashed curve B which has its origin well above $W_T$. The desired signal, solid line curve A, starts out at the origin and shows a gain slope that rises to point 25 whose $N_T$ is encountered. At this point, because the wide band threshold is exceeded by the undesired signal, the AGC becomes operative as shown in dotted curve C. (It should be noted that a forward AGC signal is shown. However, this discussion applies equally well for a reverse AGC signal. A forward AGC indicates an increasing voltage to gain reduce the tuner.) As the tuner input increases further, the AGC rises and the gain of r-f amplifier 11 is reduced, thereby causing a reduction of the undesired signal output up to point 26 where the undesired signal drops to the level of $W_T$. At this point, the AGC level holds constant and as the desired input rises still further, the gain slope is resumed up to point 27 where the desired signal reaches the $W_T$ level. At this point, the AGC action is controlled solely by the desired signal and as it increases further, the interfering signal level drops. Thus above point 27, the desired signal will dominate the tuner output.

Under normal conditions where there is no undesired signal, the onset of AGC will occur when the desired signal rises to $W_T$. At this point, it will level off and display only a slight rise with further input increases. The larger desired signal at the tuner output in the absence of undesired signals accounts for the good S/N floor in this circumstance. During the period of time that the desired signal was held to the level of the narrow band threshold in FIG. 2, there was a S/N compromise. The above shows that a strong interfering signal will cause the system performance to revert to that of a conventional narrow band system.

FIG. 3 shows an IC designed to perform the function of block 23 of FIG. 1. The circuit is operated from a power supply $V_{CC}$ coupled + to terminal 30 and − to ground terminal 31. A conventional voltage regulator 32 is included to provide a constant potential at node 33 regardless of the magnitude of $V_{CC}$.

The heat of the circuit is a differential amplifier (diff amp) 35 which is composed of transistors 36 and 37 having Darlington connected emitter follower drivers 38 and 39. The diff amp tail current $I_1$ is supplied by transistor 40. Transistor 41 along with resistor 42 acts as a tail current limiter. When the voltage drop across resistor 42 exceeds one $V_{BE}$, transistor 41 will turn on and clamp the base of transistor 40 to prevent any further increase.

The base of transistor 40 is biased by the combination of resistors 43 and 44, current source 45 and transistor 46. The base of transistor 46 is returned via terminal 47 to the meter potential (node 22 of FIG. 1). Under no signal conditions, this will be close to zero volts or ground. Transistor 46 will be on and its emitter will be one $V_{BE}$ above ground. Current $I_2$ will flow in resistor 44 thereby pulling the base of transistor below one $V_{BE}$ by the drop across resistor 44. As the tuning meter potential rises with signal level, the emitter of transistor 46 will track at one $V_{BE}$ higher and at some point transistor 40 will turn on thereby initiating $I_1$. It can be seen that $I_1$ will track the meter potential once a threshold is exceeded and this threshold will be set by the values of resistor 44 and current $I_2$ in source 45. This threshold will correspond to the curve break 25 of FIG. 2 and is defined as the narrow band threshold. Using the circuit configuration shown, this threshold is made independent of temperature.

Resistor 49 connects the bases of transistors 38 and 39 together (via resistor 53) for DC basing while capacitor 50 bypasses the base of transistor 38 to ground for r-f signals. The base of transistor 39 is driven by transistor 51, which is driven from the tuner output signal at terminal 52. This signal is the i-f output of tuner 10 at node 14 of FIG. 1. This is the wide band input to the AGC circuit. Resistors 53 and 54 act to return the collector of transistor 51 to node 33 and to provide gain of the wide band signal to differential pair 35. This acts to reduce the level of the wide band threshold, a desirable feature. This is desirable in that it allows the user a greater range over which he can adjust the wide band threshold, and thereby tailor the AGC response to particular needs.

Resistor 55 degenerates the gain of transistor 51 and acts to stabilize its operation, over temperature, signal input, and process variations.

Transistor 56, operating in conjunction with resistors 58, 59, and 60, forms a bias voltage that biases transistor 51 by way of resistor 57.

The wide band threshold occurs as follows: As was pointed out above, the output of tuner 10 at node 14 is coupled to the base of transistor 51 and the amplified signals applied to the base of transistor 39. Thus, the wide band signals are coupled to the base of transistor 37 where they are peak rectified. Capacitor 62, operating in conjunction with resistor 61 and transistor 37, is a Miller effect capacitor which creates a large capacitance from the base of transistor 37 to its emitter. This capacitance charges to the peak signal level at the emitter of transistor 39.

The peak rectified signal is in a direction that will turn transistor 37 on and thereby opposes the offset produced across resistor 53. Thus, at some level of signal at terminal 52, $I_4$ will start to flow in resistor 61. Transistor 64 is a dual collector device having a large collector 66 and a small collector 65. Since the base of transistor 64 is returned to the large collector 66, it acts as a current mirror. $I_5$ flows in the large collector and $I_8$ flows in the small collector. Assuming that the wide band input is below $W_T$, $I_1$ will be equal to $I_5$ and $I_4$ will be zero. For this condition, collector 65 of transistor 64 will be pulled close to $V_{CC}$. This will turn transistors 66 and 67 off so that no current will flow in current mirror output transistor 68 or 73.

When the wide band threshold is reached and a proportion of $I_1$ flows as $I_4$, a point is reached where the proportion of $I_4/I_5$ exceeds the size ratio of collectors 65/66. At this point the average value of $I_4$ exceeds $I_8$ and will pull the base of transistor 67 two $V_{BE}$ below $V_{CC}$. This will turn transistors 66 and 67 on and AGC current $I_6$ will be sourced out of terminal 69 from mirror transistor 68.

From the above, it can be seen that dual collector transistor 64, in combination with transistors 66 and 67, forms a threshold switch which operates in conjunction with offset voltage developed across resistor 53, due to bias current $I_3$, to determine the wide band threshold.

Since terminal 69 sources $I_6$ to the external circuit, it is a source of forward AGC. In the event that reverse AGC or a combination of forward and reverse AGC is desired, transistors 71 thru 73 can be employed. Transistor 71 is driven in parallel with transistor 68 and passes its collector current $I_9$ through diode connected transistor 72. Transistor 73, operating with transistor 72 to create a current mirror, acts to sink current $I_7$ at terminal 74. This forms a reverse AGC current sink for connection to a controlled gain stage. In the event that terminal 69 is left open, resistor 75 acts to prevent the ensuing saturation of device 68 from affecting the current $I_9$.

The invention has been described and an integrated circuit for achieving the desired functions detailed. Upon reading the foregoing description, there are alternatives and equivalents, within the spirit and intent of the invention, that will occur to a person skilled in the art. Accordingly, it is intended that the scope of the invention be limited only by the following claims.

I claim:

1. A dual threshold AGC circuit for a radio receiver that responds to variable strength signals with a first narrow band threshold and a second wide band threshold, both of which thresholds must be exceeded for said AGC to become functional, said receiver including a tuner comprising a variable gain radio frequency amplifier to produce an intermediate frequency signal, an intermediate frequency amplifier having an input coupled to said tuner, and means coupled to said intermediate frequency amplifier for developing a tuning meter output voltage which has a magnitude proportional to the in band intermediate frequency signal amplitude, said AGC circuit comprising:

a differential amplifier having first and second inputs, a single ended output, and a tail current supply;

means for modulating said tail current supply with said tuning meter voltage;

means coupled to said tail current supply for introducing a threshold in said tail current response to said tuning meter voltage whereby said tuning meter voltage must exceed said narrow band threshold to modulate said tail current;

a wide band control amplifier coupled to receive the input to said intermediate frequency amplifier and to drive said differential amplifier first and second inputs;

means for offsetting said first and second inputs of said differential amplifier to produce said wide band threshold; and means responsive to said single ended output of said differential amplifier for developing an automatic gain control current for controlling the gain of said radio frequency amplifier.

2. The improvement of claim 1 wherein said differential amplifier has its two inputs coupled together for direct current, its first input bypassed to ground, and its second input driven by said wide band control amplifier.

3. The improvement of claim 2 wherein said wide band threshold is determined in part by the current flowing in said control amplifier and is programmable as a function of an externally applied signal on said control amplifier.

4. The improvement of claim 2 wherein said differential amplifier includes a peak signal rectifier associated with said second input.

5. The improvement of claim 4 wherein said differential amplifier includes a first and second current sources coupled to act as load elements and said second current source being driven from said second input and is further coupled to a current mirror that develops said gain control current.

6. The improvement of claim 5 wherein said current sources are ratioed with the smaller of the two being coupled to said current mirror whereby said current mirror has a deadband related to said wide band threshold.

* * * * *